(12) United States Patent
Kim et al.

(10) Patent No.: US 7,986,382 B2
(45) Date of Patent: Jul. 26, 2011

(54) METHOD OF MANUFACTURING A LIQUID CRYSTAL DISPLAY HAVING TOP GATE THIN FILM TRANSISTORS WHEREIN EACH GATE ELECTRODE CONTACTS AN AUXILIARY ELECTRODE

(75) Inventors: Min Joo Kim, Seoul (KR); Ho Cheol Kang, Gyeonggi-do (KR); Kyo Seop Choo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/958,860

(22) Filed: Dec. 2, 2010

(65) Prior Publication Data

US 2011/0069265 A1    Mar. 24, 2011

Related U.S. Application Data

(62) Division of application No. 11/823,200, filed on Jun. 26, 2007, now Pat. No. 7,864,254.

(30) Foreign Application Priority Data

Dec. 11, 2006  (KR) .............................. 0125351/2006

(51) Int. Cl.
G02F 1/136  (2006.01)
G02F 1/13  (2006.01)
H01L 51/40  (2006.01)
(52) U.S. Cl. .............................. 349/47; 349/187; 438/99
(58) Field of Classification Search .................... 349/40, 349/42, 43, 46, 47, 146; 257/E21.022, E51.005; 438/99
See application file for complete search history.

(56) References Cited

U.S. PATENT DOCUMENTS 6,159,779 A    12/2000   Huang et al.
6,674,502 B1   1/2004    Terekado et al.
(Continued)

FOREIGN PATENT DOCUMENTS

CN    1396656 A    2/2003
CN    1761067 A    4/2006
(Continued)

OTHER PUBLICATIONS

Office Action issued in corresponding Chinese Patent Application No. 2007101269068; issued Mar. 12, 2009.

(Continued)

*Primary Examiner* — Mark A Robinson
*Assistant Examiner* — Paul C Lee
(74) *Attorney, Agent, or Firm* — Brinks Hofer Gilson & Lione

(57) ABSTRACT

An electrostatic discharge protection element, a liquid crystal display device having the same, and a manufacturing method. A first ESD organic TFT, a second ESD organic TFT, a third ESD organic TFT each have a gate electrode, a source electrode and a drain electrode in which the source electrode and drain electrode of the first and second ESD organic TFTs and the gate electrode of the third ESD organic TFT are electrically connected. The gate electrode and the source electrode of the first ESD organic TFT are electrically connected to a first array line and the gate electrode and the drain electrode of the second ESD organic TFT are electrically connected to a second array line. The source electrode of the third ESD organic TFT is electrically connected to a data line or a gate line and the drain of the third ESD organic TFT are electrically connected to a common voltage line.

8 Claims, 7 Drawing Sheets

U.S. PATENT DOCUMENTS

| | | |
|---|---|---|
| 2002/0003587 A1* | 1/2002 | Tsujimura et al. .............. 349/42 |
| 2003/0020845 A1 | 1/2003 | Lee et al. |
| 2005/0104097 A1 | 5/2005 | Hirose et al. |
| 2005/0140836 A1 | 6/2005 | Choi |
| 2005/0140890 A1 | 6/2005 | Kim et al. |
| 2006/0044500 A1 | 3/2006 | Nakagawa et al. |
| 2006/0202199 A1 | 9/2006 | Kim et al. |
| 2006/0223222 A1 | 10/2006 | Choi et al. |

FOREIGN PATENT DOCUMENTS

EP     1 648 030 A2     4/2006

OTHER PUBLICATIONS

Dimitrakopoulos et al. (Organic Thin Film Transistors; a Review of Recent Advances; IBM Journal of Research and Development, vol. 45, No. 1, Jan. 2001, pp. 11-15).

* cited by examiner

US 7,986,382 B2

METHOD OF MANUFACTURING A LIQUID CRYSTAL DISPLAY HAVING TOP GATE THIN FILM TRANSISTORS WHEREIN EACH GATE ELECTRODE CONTACTS AN AUXILIARY ELECTRODE

PRIORITY CLAIM

The present patent document is a divisional of U.S. patent application Ser. No. 11/823,200, filed Jun. 26, 2007 now U.S. Pat. No. 7,864,254, which claims the benefit of Korean Patent Application No. 0125351/2006 filed Dec. 11, 2006, which are incorporated by reference herein.

BACKGROUND

1. Technical Field

The present invention relates to an electrostatic discharge protection element, a liquid crystal display device having the same, and a manufacturing method thereof.

2. Description of the Related Art

A display device is implemented using a plurality of thin film transistors (TFTs). A TFT includes an amorphous silicon semiconductor or polycrystalline silicon semiconductor, an oxide silicon insulating layer, and a metal electrode.

With recent development of various conductive organic materials, extensive researches have been conducted on organic TFTs using organic semiconductors throughout the world.

The new organic semiconductors are widely applied to various types of display devices because they are prepared using various polymer synthesis methods, are easy to form in a fiber or film shape, are flexible, and are manufactured at a low cost.

Meanwhile, a liquid crystal display (LCD) device includes a plurality of pixels arranged in a matrix form. The pixels are implemented with TFTs. The LCD displays an image by controlling the respective pixels through the switching of the TFTs.

Since the LCD device is susceptible to electrostatic discharge (ESD), the LCD device includes an ESD protection element. The ESD protection element may be implemented with TFTs.

Studies have been conducted to apply organic TFTs to LCDs.

However, due to difficulties in fabrication of organic TFTs, favorable results have not been obtained.

In addition, the application of the organic TFTs to the ESD protection element has not been studied.

Therefore, the organic TFTs are applied only to the TFTs of the pixels of the LCD, and the ESD protection element is implemented with typical TFTs. Consequently, the manufacturing process of the LCD is complicated and the manufacturing cost of the LCD increases.

SUMMARY

In one embodiment, an electrostatic discharge protection element includes a first thin film transistor (TFT), a second TFT, a third TFT each having a gate electrode, a source electrode and a drain electrode. The drain electrode of the first TFT and the gate electrode of the third TFT are electrically connected and the source electrode of the second TFT and the gate electrode of the third TFT are electrically connected. The gate electrode and the source electrode of the first TFT are electrically connected to a first array line and the gate electrode and the drain electrode of the second TFT are electrically connected to a second array line. The source electrode of the third TFT is electrically connected to the first array line and the drain electrode of the third TFT is electrically connected to the second array line. Each TFT comprises an organic semiconductor layer disposed between the source electrode and drain electrode.

In another embodiment, a liquid crystal display device includes a plurality of gate lines and a plurality of data lines arranged on a substrate and unit pixels are defined by crossing points of the gate lines and the data lines. The unit pixels are located in a display region. Each unit pixel includes a pixel organic thin film transistor (TFT). A pixel electrode is connected to the pixel organic TFT. A common voltage line is disposed in a non-display region of the substrate. A plurality of electrostatic discharge (ESD) protection elements are provided in the non-display region. Each ESD protection element is electrically coupled to the data line or the gate line and the common voltage line and each ESD protection element includes three ESD organic TFTs. Each ESD protection element includes a first ESD organic TFT, a second ESD organic TFT, and a third ESD organic TFT, with each having a gate electrode, a source electrode and a drain electrode. The first ESD organic TFT and the second ESD organic TFT are connected in parallel and the third ESD organic TFT is connected between the first ESD organic TFT and the second ESD organic TFT.

In yet another embodiment, a method is disclosed for manufacturing an LCD device having organic electrostatic discharge protection devices. In the disclosed method, a light blocking pattern is formed on a substrate. The light blocking pattern is formed in a display region of the substrate and a non-display region of the substrate. A first metal material is deposited to overly the light blocking layer to thereby form source and drain electrodes for a pixel thin film transistor (TFT) and a plurality of electrostatic discharge (ESD) TFTs. A pixel electrode is formed such that it is connected to the drain electrode of the organic pixel TFT. An organic semiconductor layer, an organic insulating layer, and an auxiliary electrode layer overlying the source and drain regions are sequentially formed and patterned to form a gate stack. A passivation layer is formed to overly the gate stack and a contact hole is formed exposing a portion of the gate stack. A gate electrode and a gate line are formed to overly the passivation layer and to contact the auxiliary electrode through the contact hole.

It is to be understood that both the foregoing general description and the following detailed description of the present invention are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
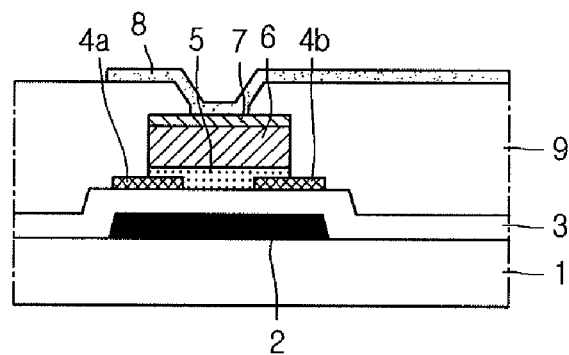
FIG. 1 is a cross-sectional view of an organic TFT according to an embodiment.

Reference will now be made in detail to the preferred embodiments of the present invention, examples of which are illustrated in the accompanying drawings. In the drawings, the thicknesses of layers and regions are exaggerated for clarity. Wherever possible, the same reference numbers will be used throughout the drawings to refer to the same or like parts.

FIG. 1 is a cross-sectional view of an organic TFT according to an embodiment.

The organic TFT according to this embodiment is a top gate type TFT where a gate electrode 8 is disposed at the uppermost layer.

Referring to FIG. 1, a light blocking layer 2 is disposed in a predetermined portion of a substrate 1. The predetermined portion of the substrate 1 represents a region where the organic TFT will be formed. The light blocking layer 2 serves to prevent a channel characteristic from being affected by the deformation of an organic semiconductor layer, which is caused by light. The organic semiconductor layer, which will be described in more detail later, is formed of an organic semiconductor material. In general, the light blocking layer 2 is formed of light blocking material or light absorbing material. For example, the light blocking layer 2 may be formed of chrome oxide ($CrO_x$) having an optical density of 3.5 or above, metal such as chrome, or carbon based material.

A buffer layer 3 is disposed over the light blocking layer 2 and the substrate 1. The buffer layer 3 may be formed of an oxide material such as silicon oxide ($SiO_2$). The buffer layer 3 facilitates the formation of subsequent layers. If the light blocking layer is not made of a metal, the formation of the buffer layer 3 is not always necessary.

A source electrode 4a and a drain electrode 4b are disposed spaced apart from each other on the buffer layer 3.

An organic semiconductor layer 5 is disposed on the source electrode 4a and the drain electrode 4b. The organic semiconductor layer 5 is formed of an organic semiconductor material. The organic semiconductor layer 5 is disposed on portions of the source electrode 4a and the drain electrode 4b and the buffer layer 3 between the source electrode 4a and the drain electrode 4b. Examples of the organic semiconductor material may include, but are not limited to, pentacene, copper phthalocyanine, polythiophene, polyaniline, polyacetylene, polypyrrole, polyphenylene vinylene, or derivatives thereof.

An organic gate insulating layer 6 is disposed on the organic semiconductor layer 5. The organic gate insulating layer 6 is formed of an organic insulating material. Examples of the organic insulating material may include, but are not limited to, polyimide.

An auxiliary electrode 7 is disposed on the organic gate insulating layer 6. The auxiliary electrode 7 is electrically connected to a gate electrode that will be formed later. The auxiliary electrode 7 can serve as an etch stop layer, which will be described later.

The organic semiconductor layer 5, the organic gate insulating layer 6, and the auxiliary electrode 7 may have the same width.

A passivation layer 9 is formed over the auxiliary electrode 7 and the substrate 1. The passivation layer 9 has a contact hole 35 exposing the auxiliary electrode 7 (see FIG. 2D). The passivation layer 9. protects the source electrode 4a, the drain electrode 4b, and the organic semiconductor layer 5.

A gate electrode 5 is disposed on the passivation layer 9 and is electrically connected to the auxiliary electrode 7 through the contact hole 35.

In order to prevent light irradiation onto the organic semiconductor layer 5, the light blocking layer 2 may have a width greater than that of the organic semiconductor layer 5. Hence, light transmitted through the rear surface of the substrate 1 is not irradiated onto the organic semiconductor layer 5 because the light blocking layer 2 has the width greater than the organic semiconductor layer 5.

Therefore, the organic TFT may be configured in a top gate type. That is, the organic semiconductor layer 5 and the organic gate insulating layer 6 are disposed on the source/drain electrodes 4a and 4b and the gate electrode 8 is disposed on the organic gate insulating layer 6.

FIGS. 2A to 2E are cross-sectional views illustrating a method for manufacturing an organic TFT according to an embodiment.

Figure 2A:
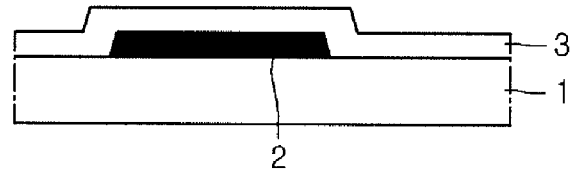
FIGS. 2A to 2E are cross-sectional views illustrating a method for manufacturing an organic TFT according to an embodiment.

Referring to FIG. 2A, a light blocking material is deposited on a substrate 1 and is patterned to form a light blocking layer 2 in a predetermined region. Examples of the light blocking material may include, but are not limited to, chrome oxide (CrOx) having an optical density of 3.5 or above, metal such as chrome, or carbon based material.

An oxide material such as silicon oxide is deposited over the light blocking layer 2 and the substrate 1 to form a buffer layer 3. The formation of the buffer layer 3 is not always necessary.

Figure 2B:
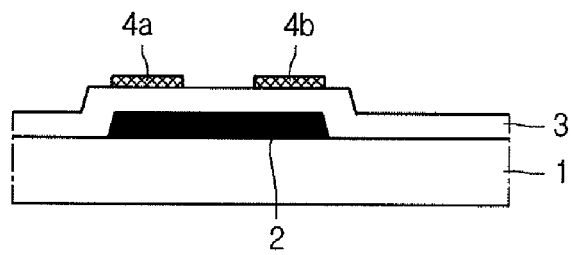

Referring to FIG. 2B, a first metal material is deposited on the buffer layer 3 and is patterned to form a source electrode 4a and a drain electrode 4b spaced apart from each other. Examples of the first metal material may include, but are not limited to, gold (Au), silver (Ag), aluminum (Al), nickel (Ni), chrome (Cr), and molybdenum (Mo).

Figure 2C:
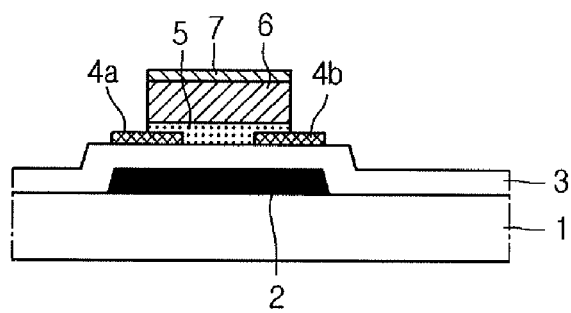

Referring to FIG. 2C, an organic semiconductor material, an organic insulating material, and a second metal material are sequentially deposited on the source/drain electrodes 4a and 4b and the substrate 1 and are patterned to form an organic semiconductor layer 5, an organic gate insulating layer 6, and an auxiliary electrode 7. The organic semiconductor layer 5, the organic gate insulating layer 6, and the auxiliary electrode 7 are formed on portions of the source electrode 4a and the drain electrode 4b and the buffer layer 3 between the source electrode 4a and the drain electrode 4b. Portions of the source/drain electrodes 4a and 4b may be exposed by the patterning process. In the LCD, the exposed portions may be electrically connected to a pixel electrode.

The organic semiconductor layer 5 may have a width smaller than that of the light blocking layer 2. In this case, light transmitted through the rear surface of the substrate 1 can be prevented from being irradiated onto the organic semiconductor layer 5.

Examples of the organic semiconductor material may include, but are not limited to, pentacene, copper phthalocyanine, polythiophene, polyaniline, polyacetylene, polypyrrole, polyphenylene vinylene, or derivatives thereof.

Examples of the organic insulating material may include, but are not limited to, polyimide.

Examples of the second metal material may include, but are not limited to, gold (Au), silver (Ag), aluminum (Al), nickel (Ni), chrome (Cr), and molybdenum (Mo).

Figure 2D:
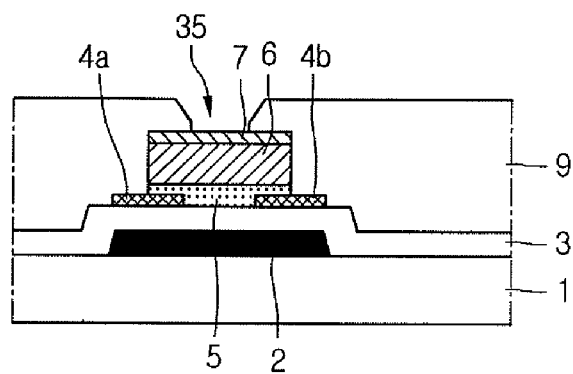

Referring to FIG. 2D, an organic insulating material or an inorganic insulating material is deposited on the auxiliary electrode 7 and the substrate 1 and is patterned to expose the auxiliary electrode 7, thereby forming a passivation layer 9 having a contact hole 35.

In this case, the auxiliary electrode 7 serves as an etch stop layer. Specifically, an organic gate insulating layer is formed under the auxiliary electrode 7. If the organic insulating material or an inorganic insulating material is patterned in the absence of the auxiliary electrode 7, the organic gate insulating layer 6 may also be patterned. Therefore, the auxiliary electrode 7 can serve as an etch stop layer because it can prevent the organic gate insulating layer 6 from being patterned during the process of etching the organic insulating material or the inorganic insulating material.

Figure 2E:
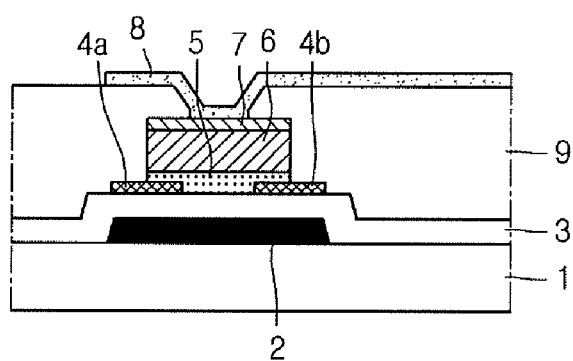

Referring to FIG. 2E, a third metal material is deposited on the passivation layer 9 and is patterned to form a gate electrode 8. The gate electrode 8 is electrically connected to the auxiliary electrode 7 through the contact hole 35.

Examples of the third metal material may include, but are not limited to, gold (Au), silver (Ag), aluminum (Al), nickel (Ni), chrome (Cr), and molybdenum (Mo).

Figure 3:
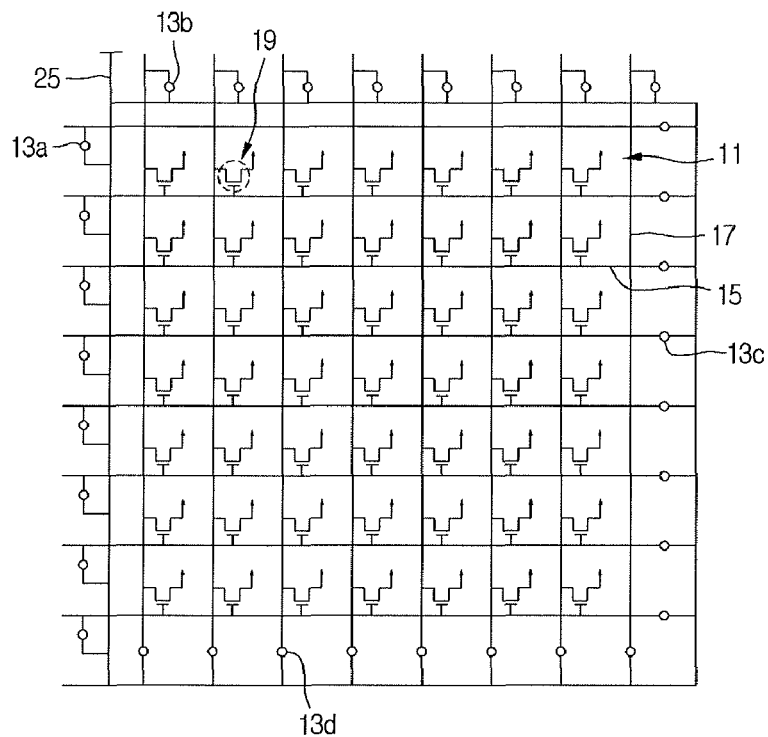
FIG. 3 is a circuit diagram of an LCD having organic TFTs according to an embodiment of the present invention.
Figure 4:
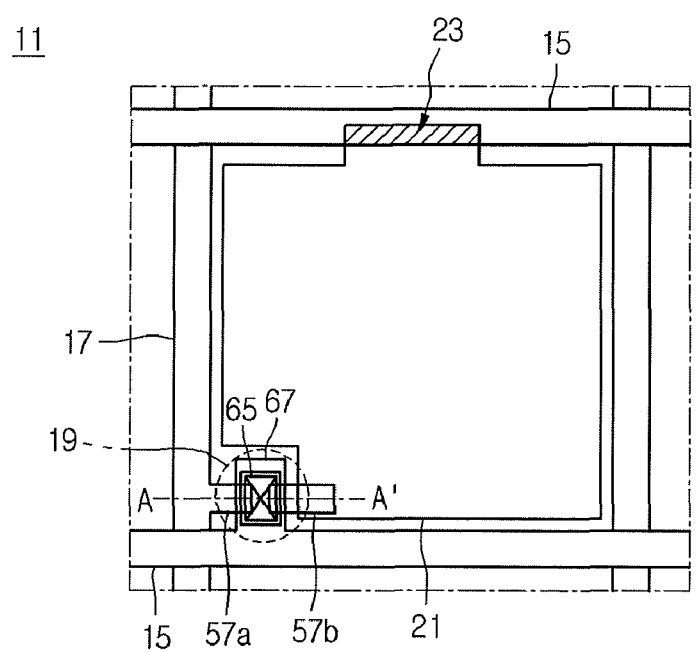
FIG. 4 is a plan view of a unit pixel of the LCD illustrated in FIG. 3.
Figure 5:
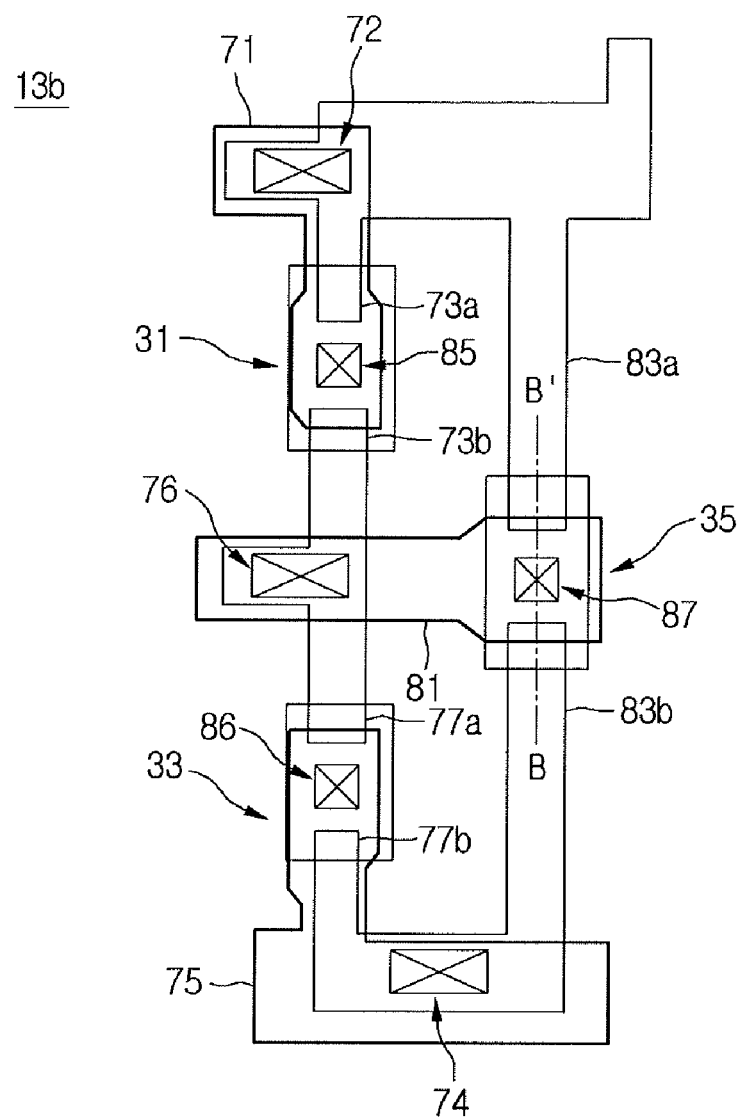
FIG. 5 is a plan view of an ESD protection element in the LCD illustrated in FIG. 3.
Figure 6:
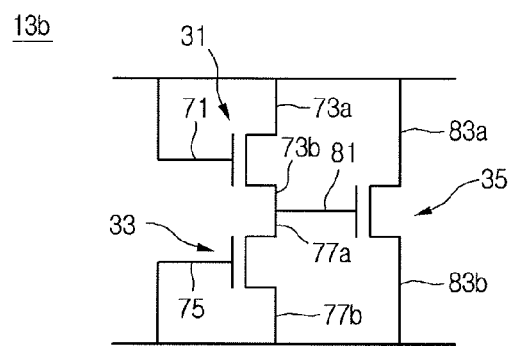
FIG. 6 is an equivalent circuit diagram of the ESD protection element illustrated in FIG. 5.

FIG. 3 is a circuit diagram of an LCD having the organic TFTs according to an embodiment of the present invention, FIG. 4 is a plan view of a unit pixel of the LCD illustrated in FIG. 3, FIG. 5 is a plan view of an ESD protection element in the LCD illustrated in FIG. 3, and FIG. 6 is an equivalent circuit diagram of the ESD protection element illustrated in FIG. 5.

Referring to FIGS. 3 and 4, a plurality of gate lines 15 and a plurality of data lines 17 are arranged to cross one another. Unit pixels 11 are defined by the crossing of the gate lines 15 and the data lines 17.

Therefore, the unit pixels 11 are arranged in a matrix form. A region where the pixels 11 are arranged in a matrix form is defined as a display region, and the other region is defined as a non-display region.

Organic TFTs 19 are connected to the gate lines 15 and the data lines 17. The organic TFT 19 has the same structure as that of the organic TFT illustrated in FIG. 1. Pixel electrodes 21 are connected to the organic TFTs 19. The organic TFT has a gate electrode 67 integrally formed with the gate line 15, a source electrode 57a integrally formed with a data line 17, and a drain electrode 57b spaced apart from the source electrode 57a and electrically connected to the pixel electrode 21.

Due to a contact hole 65, the gate electrode 67 is formed on an organic gate insulating layer (not shown) under a passivation layer (not shown).

The pixel electrode 21 is disposed to partially overlap the gate line 15. Therefore, a storage capacitor 23 is formed by the pixel electrode 21 and the gate line 15. The storage capacitor 23 serves to maintain a data voltage during one frame.

In addition, a common voltage line 25 is disposed in the non-display region, while surrounding the display region. That is, the common voltage line 25 is disposed along an edge of the LCD and supplies a common voltage. In the case of a twisted nematic (TN) mode, the common voltage line 25 may be electrically connected to a common electrode disposed in a top substrate facing a bottom substrate where the organic TFT 19 is disposed. In the case of an in-plane switching (IPS) mode, the common voltage line 25 may be electrically connected to a common electrode disposed in the pixel 11 of the bottom substrate.

The common voltage line 25 may be disposed on the same layer as the data line 17 or on the same layer as the gate line 15. In the following description, it is assumed that the common voltage line 25 is disposed on the same layer as the data line 17.

In addition, a plurality of ESD protection elements 13a to 13d are disposed in the non-display region so as to protect the LCD against ESD. Specifically, a first ESD protection element 13a is disposed between the gate line 15 and the common voltage line 25, a second ESD protection element 13b is disposed between the data line 17 and the common voltage line 25, a third ESD protection element 13c is disposed between the gate line 15 and the common voltage line 25, and a fourth ESD protection element 13d is disposed between the data line 17 and the common voltage line 25.

As illustrated in FIGS. 5 and 6, each of the ESD protection elements 13a to 13d may include first to third organic TFTs 31, 33 and 35. For convenience, the second ESD protection element will be described below.

The first to third organic TFTs 31, 33 and 35 have the same structure as that of the organic TFT illustrated in FIG. 1. However, since the first to third organic TFTs 31, 33 and 35 must be turned on by a high voltage such ESD, they may be relatively larger in size than the TFT 19 of the pixel 11.

The first organic TFT 31 has a first gate electrode 71 and a first source electrode 73a commonly connected to each other.

The second organic TFT 33 has a second gate electrode 75 and a second drain electrode 77b commonly connected to each other, and a second source electrode 77a connected to a first drain electrode 73b of the first organic TFT 31.

The third organic TFT 35 has a third gate electrode 81 connected to the first drain electrode 73b of the first organic TFT 31 and the second source electrode 77a of the second organic TFT 33, a third source electrode 83a connected to the first source electrode 73a of the first organic TFT 31, and a third drain electrode 83b connected to the second drain electrode 77b of the second organic TFT 33.

Therefore, the first organic TFT 31 and the second organic TFT 33 may be connected in parallel, and the third organic TFT 35 may be connected between the first organic TFT 31 and the second organic TFT 33.

More specifically, the first source electrode 73a of the first organic TFT 31 and the third source electrode 83a of the third organic TFT 35 may be integrally formed.

In the first organic TFT 31, the first gate electrode 71 is electrically connected to the first source electrode 73a through a first contact hole 72.

The second drain electrode 77b of the second organic TFT 33 and the third drain electrode 83b of the third organic TFT 35 may be integrally formed.

In the second organic TFT 33, the second gate electrode 75 is electrically connected to the second drain electrode 77b through a second contact hole 74.

The first drain electrode 73b of the first organic TFT 31 and the second source electrode 77a of the second organic TFT 33 may be integrally formed.

In the third organic TFT 35, the third gate electrode 81 is electrically connected to the first drain electrode 73b of the first organic TFT 31 and the second source electrode 77a of the second organic TFT 33 through a third contact hole 76.

Meanwhile, a fourth contact hole 85 may be formed between the first source electrode 73a and the first drain electrode 73b of the first organic TFT 31, a fifth contact hole 86 may be formed between the second source electrode 77a and the second drain electrode 77b of the second organic TFT 33, and a sixth contact hole 87 may be formed between the third source electrode 83a and the third drain electrode 83b of the third organic TFT 35. The fourth to sixth contact holes 85, 86 and 87 are formed on a passivation layer (not shown). Due to the fourth to sixth contact holes 85, 86 and 87, the first to third gate electrodes 71, 75 and 81 are formed in the organic gate insulating layer (not shown) under the passivation layer.

The common voltage line 25 is disposed on the same layer as the data line 17. Therefore, in the second ESD protection element 13b, the first source electrode 73a of the first organic TFT 31 and the third source electrode 83a of the third organic TFT 35 may be electrically connected to the data line 17, and the second drain electrode 77b of the second organic TFT 33 and the third drain electrode 83b of the third organic TFT 35 may be electrically connected to the common voltage line 25.

The first and second organic TFTs 31 and 33 are diode-connected transistors that allow a forward current flow, but block a reverse current flow.

When the first organic TFT 31 is turned on by a high voltage such as ESD flowing through the data line 17, the high voltage passes through the first organic TFT 31 and turns on the third organic TFT 35. Accordingly, the third organic TFT 35 between the data line 17 and the common voltage line 25 is turned on and thus a static electricity passes through the third organic TFT 35 and flows through the common voltage line 25. Consequently, the TFT 19 or the pixel electrode 21 connected to the data line 17 in the display region is not damaged.

FIGS. 7A to 7F are cross-sectional views illustrating a method for manufacturing an LCD according to an embodiment. Specifically, FIGS. 7A to 7F are cross-sectional views taken along line A-A' of FIG. 4 and line B-B' of FIG. 5.

A method for manufacturing an LCD according to an embodiment will be described below with reference to FIGS. 3 to 5 and 7A to 7F.

Figure 7A:
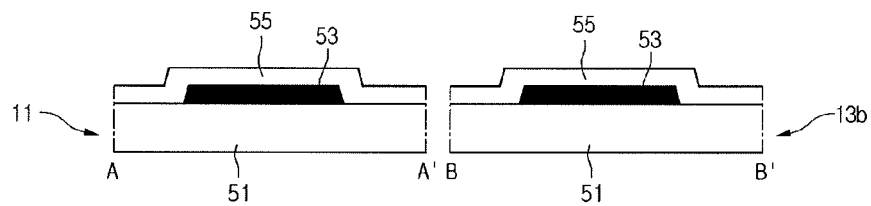
FIGS. 7A to 7F are cross-sectional views illustrating a method for manufacturing an LCD according to an embodiment.

Referring to FIG. 7A, a light blocking material is deposited on a substrate 51 and is patterned to form a light blocking layer 53 in a predetermined region. The predetermined region represents a region where an organic TFT will be formed, and may be a region where organic TFTs of pixels 11 of the display region are formed and a region where first to third organic TFTs of ESD protection elements 13a to 13d are formed.

Examples of the light blocking material may include, but are not limited to, chrome oxide (CrOx) having an optical density of 3.5 or above, metal such as chrome, or carbon based material.

The light blocking layer 53 prevents irradiation of external light onto the organic TFT.

An oxide material such as silicon oxide is deposited over the light blocking layer 53 and the substrate 51 to form a buffer layer 55. The buffer layer 55 facilitates the formation of subsequent layers. It is preferable that the buffer layer 55 is formed as thin as possible. In some cases, the buffer layer 55 need not be formed.

Figure 7B:
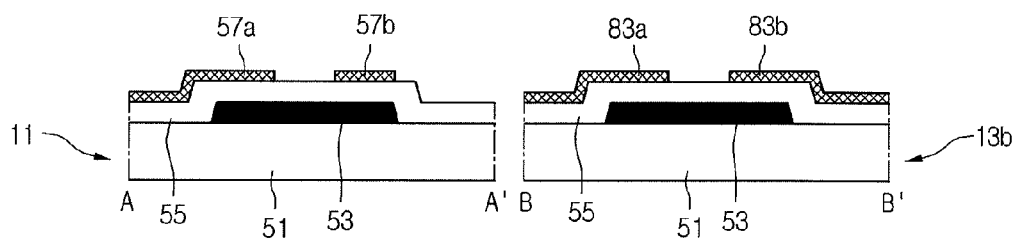

Referring to FIG. 7B, a first metal material is deposited on the buffer layer 55 and is patterned to form source electrodes 57a, 73a, 77a and 83a, drain electrodes 57b, 73b, 77b and 83b, a data line 17, and a common voltage line 25. The source electrode 57a and the drain electrode 57b may be formed in the organic TFT region of the pixel 11, and the first to third source electrodes 73a, 77a and 83a and the first to third drain electrodes 73b, 77b and 83b may be formed in the first to third TFT regions of the ESD protection elements 13a to 13d, respectively.

The source electrode 57a is integrally formed with the data line 17. The drain electrode 57a may be formed spaced apart from the source electrode 83a by a predetermined distance.

The first source electrode 73a and the third source electrode 83a are integrally formed, the second drain electrode 77b and the third drain electrode 83b are integrally formed, and the first drain electrode 83b and the second source electrode 77a are integrally formed.

Examples of the first metal material may include, but are not limited to, gold (Au), silver (Ag), aluminum (Al), nickel (Ni), chrome (Cr), and molybdenum (Mo).

Figure 7C:
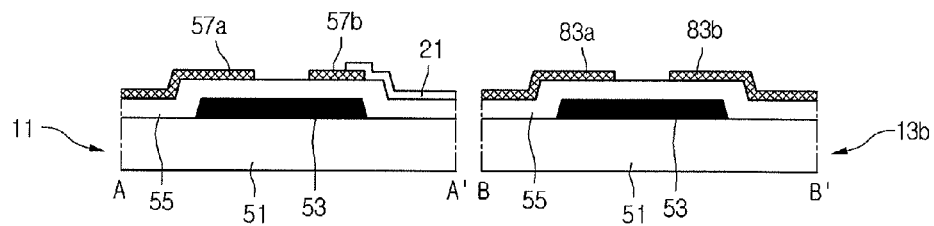

Referring to FIG. 7C, a transparent conductive material is deposited on the data line 17 and the substrate 51 and is patterned to form a pixel electrode 21. The pixel electrode 21 is formed in the pixel 11, but not in the ESD protection elements 13a to 13d. Examples of the conductive material may include, but are not limited to, indium tin oxide (ITO) and indium zinc oxide (IZO).

The pixel electrode 21 may be formed to partially overlap the drain electrode 57b. Therefore, the drain electrode 57b and the pixel electrode 21 are electrically connected to each other.

Figure 7D:
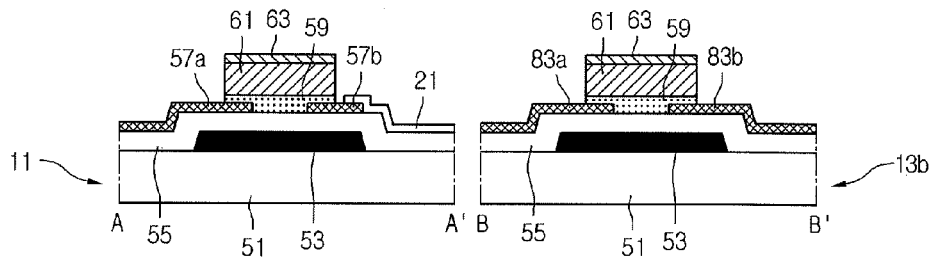

Referring to FIG. 7D, an organic semiconductor material, an organic insulating material, and a second metal material are sequentially deposited on the pixel electrode 21 and the substrate 51 and are patterned to form an organic semiconductor layer 59, an organic gate insulating layer 61, and an auxiliary electrode 63. The organic semiconductor layer 59, the organic gate insulating layer 61, and the auxiliary electrode are formed on portions of the source electrode 57a and the drain electrode 57b and the buffer layer 55 between the source electrode 57a and the drain electrode 57b. The formation of the buffer layer 55 is not always necessary.

Examples of the organic semiconductor material may include, but are not limited to, pentacene, copper phthalocyanine, polythiophene, polyaniline, polyacetylene, polypyrrole, polyphenylene vinylene, or derivatives thereof.

Examples of the organic insulating material may include, but are not limited to, polyimide.

Examples of the second metal material may include, but are not limited to, gold (Au), silver (Ag), aluminum (Al), nickel (Ni), chrome (Cr), and molybdenum (Mo).

Figure 7E:
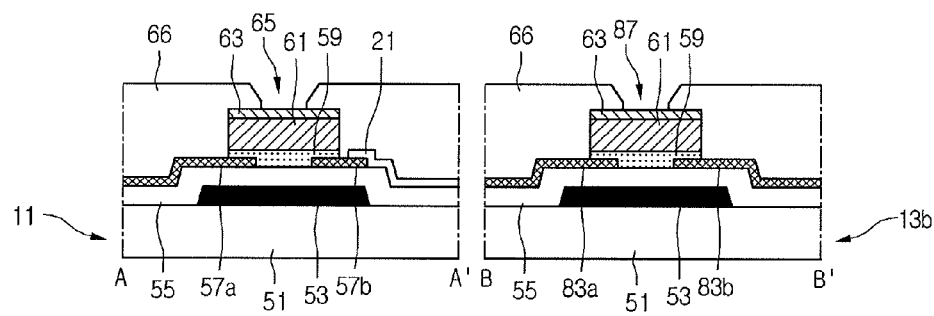

Referring to FIG. 7E, an organic insulating material or an inorganic insulating material is deposited on the auxiliary electrode 63 and the substrate 51 and is patterned to expose the first and second source electrodes 73a and 77a and the first and second drain electrodes 73b and 77b of the ESD protection elements 13a to 13d and the auxiliary electrode 63, thereby forming a passivation layer 66 having contact holes 65, 72, 74, 76, 85, 86 and 87. In this case, the auxiliary electrode 63 serves as an etch stop layer. Specifically, an organic gate insulating layer 61 is formed under the auxiliary electrode 63. If the organic insulating material or an inorganic insulating material is patterned in the absence of the auxiliary electrode 63, the organic gate insulating layer 61 may also be patterned. Therefore, the auxiliary electrode 63 can serve as an etch stop layer because it can prevent the organic gate insulating layer 61 from being patterned during the process of etching the organic insulating material or the inorganic insulating material.

Figure 7F:
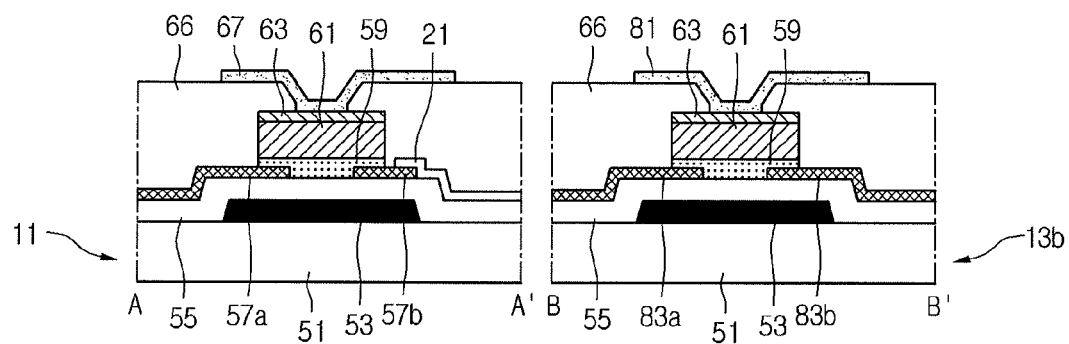

Referring to FIG. 7F, a third metal material is deposited on the passivation layer 66 and is patterned to form a gate electrode 67 and a gate line 15. The common voltage line 25 may be formed on the same layer as the gate line 15.

The gate electrode 67 of the pixel 11 may be electrically connected to the auxiliary electrode 63 through the contact hole 65.

In order to connect the first to third organic TFTs 31, 33 and 35 in the ESD protection elements 13a to 13d, the first gate electrode 71 is electrically connected to the first source electrode 73a through the first contact hole 72, the second gate electrode 75 is electrically connected to the second drain electrode 77b through the second contact hole 74, and the third gate electrode 81 is electrically connected to the first drain electrode 73b or the second source electrode 77a through the third contact hole 76.

In addition, the first gate electrode 71 is electrically connected to the auxiliary electrode 63 through the fourth contact hole 85, the second gate electrode 75 is electrically connected to the auxiliary electrode 63 through the fifth contact hole 86, and the third gate electrode 81 is electrically connected to the auxiliary electrode 63 through the sixth contact hole 87.

Examples of the third metal material may include, but are not limited to, gold (Au), silver (Ag), aluminum (Al), nickel (Ni), chrome (Cr), and molybdenum (Mo).

Through these procedures, the LCD including the ESD protection elements 13a to 13d and the pixels 11 arranged in a matrix form can be manufactured.

As described above, the present invention facilitates the formation of the organic TFT and can increase the applicability of the organic TFT to the pixels or the ESD protection elements of the LCD.

In addition, the present invention can improve the structure of the organic TFT and simplify the manufacturing process of the organic TFT, thereby expanding the applicability to other fields.

Furthermore, the organic TFTs for the pixels of the display region and the ESD protection elements can be manufactured through the same manufacturing process, thereby simplifying the manufacturing process of the LCD and remarkably reducing the manufacturing cost of the LCD.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of manufacturing an LCD device having organic electrostatic discharge protection devices, the method comprising:

forming a light blocking pattern on a substrate;
wherein the light blocking pattern is formed in a display region of the substrate and a non-display region of the substrate;
forming source and drain electrodes for a pixel organic thin film transistor (TFT) and a plurality of electrostatic discharge (ESD) organic TFTs overlying the light blocking layer;
forming a pixel electrode connected to the drain electrode of the organic pixel TFT;
sequentially forming an organic semiconductor layer, an organic insulating layer, and an auxiliary electrode layer overlying the source and drain electrodes;
forming a passivation layer overlying the gate stack and forming contact hole exposing a portion of the auxiliary electrode;
forming a gate electrode contacting the auxiliary electrode through the contact hole to form the pixel organic TFT and the ESD organic TFTs.

2. The method of claim 1, wherein an ESD protection element is formed by the ESD organic TFTs.

3. The method of claim 1, further comprising forming a buffer layer over the light blocking layer.

4. The method of claim 2, wherein the pixel organic TFT is formed in the display region, and the ESD protection element is formed in the non-display region.

5. The method of claim 3, wherein forming a gate electrode contacting the auxiliary electrode through the contact hole further comprises forming an electrically connection between the source electrode of the first TFT and one of a gate line or a data line and the drain electrode of a second TFT to a common voltage line.

6. The method of claim 3, wherein the organic semiconductor layer comprises one of pentacene, copper phthalocyanine, polythiophene, polyaniline, polyacetylene, polypyrrole, polyphenylene vinylene, or derivatives thereof.

7. The method of claim 3, wherein the source and drain electrodes, the gate electrodes, and auxiliary electrodes comprise one of gold (Au), silver (Ag), aluminum (Al), nickel (Ni), chrome (Cr), or molybdenum (Mo).

8. The method of claim 3, wherein the light blocking layer comprises one of chrome oxide (CrOx) having an optical density of 3.5 or above, chrome (Cr), or carbon based material.

* * * * *